(12) United States Patent
Shalibo et al.

(10) Patent No.: US 11,281,111 B2
(45) Date of Patent: Mar. 22, 2022

(54) OFF-AXIS ILLUMINATION OVERLAY MEASUREMENT USING TWO-DIFFRACTED ORDERS IMAGING

(71) Applicant: KLA-TENCOR CORPORATION, Milpitas, CA (US)

(72) Inventors: Yoni Shalibo, Binyamina (IL); Yuri Paskover, Binyamina (IL); Vladimir Levinski, Migdal HaEmek (IL); Amnon Manassen, Haifa (IL); Shlomo Eisenbach, Migdal HaEmek (IL); Gilad Laredo, Migdal HaEmek (IL); Ariel Hildesheim, Migdal HaEmek (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 562 days.

(21) Appl. No.: 16/317,603

(22) PCT Filed: Dec. 14, 2018

(86) PCT No.: PCT/US2018/065579
§ 371 (c)(1),
(2) Date: Jan. 14, 2019

(87) PCT Pub. No.: WO2020/046408
PCT Pub. Date: Mar. 5, 2020

(65) Prior Publication Data
US 2020/0132446 A1    Apr. 30, 2020

Related U.S. Application Data (60) Provisional application No. 62/723,944, filed on Aug. 28, 2018.

(51) Int. Cl.
| | | |
|---|---|---|
| *G03F 7/20* | (2006.01) | |
| *G01B 11/27* | (2006.01) | |
| *G01B 11/14* | (2006.01) | |

(52) U.S. Cl.
CPC .......... *G03F 7/70633* (2013.01); *G01B 11/14* (2013.01); *G01B 11/272* (2013.01); *G03F 7/70616* (2013.01)

(58) Field of Classification Search
CPC ......... G01B 11/02; G01B 11/14; G01B 11/26; G01B 11/2755; G01B 11/27;
(Continued)

(56) References Cited

U.S. PATENT DOCUMENTS

| | | |
|---|---|---|
| 7,528,953 B2 | 5/2009 | Frommer et al. |
| 8,456,641 B1 | 6/2013 | Levinski et al. |

(Continued)

FOREIGN PATENT DOCUMENTS

WO    2007143056 A1    12/2007

OTHER PUBLICATIONS

ISA/KR, International Search Report for PCT/US2018/065579 May 23, 2019.

*Primary Examiner* — Gordon J Stock, Jr.
(74) *Attorney, Agent, or Firm* — Hodgson Russ LLP (57) ABSTRACT

Metrology methods and tools are provided, which enhance the accuracy of the measurements and enable simplification of the measurement process as well as improving the correspondence between the metrology targets and the semiconductor devices. Methods comprise illuminating the target in a Littrow configuration to yield a first measurement signal comprising a $-1^{st}$ diffraction order and a $0^{th}$ diffraction order and a second measurement signal comprising a $+1^{st}$ distraction order and a $0^{th}$ diffraction order, wherein the $-1^{st}$ diffraction order of the first measurement signal and the $+1^{st}$ diffraction order of the second measurement signal are diffracted at 180° to a direction of the illumination, performing a first measurement of the first measurement signal and a second measurement of the second measurement signal, (Continued)

and deriving metrology metric(s) therefrom. Optionally, a reflected $0^{th}$ diffraction order may be split to yield components which interact with the $-1^{st}$ and $+1^{st}$ diffraction orders.

29 Claims, 7 Drawing Sheets

(58) Field of Classification Search
CPC ............ G01B 11/272; G01N 21/9501; G01N 21/956; G03F 7/70616; G03F 7/70625; G03F 7/70633
See application file for complete search history.

(56) References Cited

U.S. PATENT DOCUMENTS

| | | | |
|---|---|---|---|
| 10,677,588 B2* | 6/2020 | Hill | G03F 7/70633 |
| 2006/0197951 A1* | 9/2006 | Frommer | G03F 7/70633 |
| | | | 356/401 |
| 2007/0279630 A1* | 12/2007 | Kandel | G03F 7/70633 |
| | | | 356/401 |
| 2012/0206703 A1 | 8/2012 | Bhattacharyya et al. | |
| 2016/0103946 A1 | 4/2016 | El Kodadi et al. | |
| 2017/0146915 A1 | 5/2017 | Levinski et al. | |
| 2017/0268869 A1 | 9/2017 | Levinski et al. | |
| 2018/0031424 A1* | 2/2018 | Hill | G01B 11/272 |
| 2021/0191278 A1* | 6/2021 | Tel | G03F 7/705 |

\* cited by examiner

Figure 5 (contiued)

US 11,281,111 B2

OFF-AXIS ILLUMINATION OVERLAY MEASUREMENT USING TWO-DIFFRACTED ORDERS IMAGING

CROSS REFERENCE TO RELATED APPLICATIONS

This application claims the benefit of U.S. Provisional Patent Application No. 62/723,944 filed on Aug. 28, 2018, which is incorporated herein by reference in its entirety.

BACKGROUND OF THE INVENTION

1. Technical Field

The present invention relates to the field of metrology, and more particularly, to illumination and measurement configurations that enhance measurement accuracy.

2. Discussion of Related Art

Optical overlay measurement is usually classified into one of two types: imaging or scatterometry. In imaging-based overlay (IBO), patterns of the target are printed side-by-side in two separate layers, and their lateral shift is measured in the image plane with respect to the optical system. In scatterometry, diffraction-based overlay (DBO), patterns from different layers are printed one above the other, and the overlay is obtained from the amplitudes of the diffracted orders of the stack. Detailed principles of this measurement are beyond the scope of this document.

Imaging technologies may be further categorized into two main configurations: Bright and Dark field imaging. While in Bright field imaging, the image is composed of all the diffracted orders that fit within the numerical aperture of the system, in Dark field imaging, the 0th order is blocked. The latter is typically used for superior image contrast/precision. As indicated in previous works, one may improve measurement accuracy by order selection, as taught, e.g., by WIPO Publication No. 2007143056, incorporated herein by reference in its entirety. For example, selecting only the 0th and ±1st orders leads to improved accuracy at best contrast focus, as taught, e.g., by U.S. Patent Application Publication No. 20170146915, incorporated herein by reference in its entirety. Further improvement of accuracy and contrast within this configuration is possible via control of the amplitude and phase of the zero order, as taught, by U.S. Patent Application Publication No. 20170146915, incorporated herein by reference in its entirety. In the prior art, the best results may be achieved by selecting only the ±1st orders, at the expense of signal amplitude.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of measuring a metrology target by a metrology tool having an illumination arm and a collection arm, the method comprising: illuminating the target, by the illumination arm, in a Littrow configuration to yield a first measurement signal comprising a $-1^{st}$ diffraction order and a $0^{th}$ diffraction order and a second measurement signal comprising a $+1^{st}$ diffraction order and a $0^{th}$ diffraction order, wherein the $-1^{st}$ diffraction order of the first measurement signal and the $+1^{st}$ diffraction order of the second measurement signal are diffracted at 180° to a direction of the illumination, performing, by the collection arm, a first measurement of the first measurement signal and a second measurement of the second measurement signal, and deriving at least one metrology metric from the first and second measurements.

One aspect of the present invention provides a method of measuring a metrology target by a metrology tool having an illumination arm and a collection arm, the method comprising: illuminating the target, by the illumination arm, to yield a reflected $0^{th}$ diffraction order and $-1^{st}$ and $+1^{st}$ diffraction orders, splitting, in the collection arm, the reflected $0^{th}$ diffraction order into a first component which is captured with the diffraction order and a second component which is captured with the $+1^{st}$ diffraction order, to yield corresponding first and second measurements, and deriving at least one metrology metric from the first and second measurements.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same, may be carried into effect, reference will now be made, purely by way of example, to the accompanying drawings in which like numerals designate corresponding elements or sections throughout.

In the accompanying drawings.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for fundamental understanding of the invention, the description taken with the drawings making apparent to those skilled in the art how the several forms of the invention may be embodied in practice.

Before at least ones embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, ear similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation an the visual range, ultraviolet or even shorter wave radiation such as x rays, and possibly even particle beams.

Metrology methods and tools are provided, which enhance the accuracy of the measurements and enable simplification of the measurement process as well as improving the correspondence between the metrology targets and the semiconductor devices. Methods comprise illuminating the target in a Littrow configuration to yield a first measurement signal comprising a $-1^{st}$ diffraction order and a $0^{th}$ diffraction order and a second measurement signal comprising a $+1^{st}$ diffraction order and a $0^{th}$ diffraction order, wherein the $-1^{st}$ diffraction order of the first measurement signal and the $+1^{st}$ diffraction order of the second measurement signal acre diffracted at 180° to a direction of the illumination, performing a first measurement of the first measurement signal and a second measurement of the second measurement signal, and deriving metrology metric(s) therefrom. Alternatively or complementarily, a reflected $0^{th}$ diffraction order may be split to yield components which interact with the $-1^{st}$ and $+1^{st}$ diffraction orders.

Optical overlay tools measure overlay on representative targets, the design of which is optimized for measurability at optical wavelengths, and for compatibility with the lithography and process steps. As device pitch is scaled down, these two opposing criteria lead to optimized targets being either less compatible with the device (thereby often leading to an overlay bias), or more challenging to measure due to their reduced diffraction efficiency. Advantageously, disclosed embodiments provide ways to increase the sensitivity of the measurement apparatus, and to facilitate measurement of targets with low diffraction efficiency, while not compromising measurement accuracy.

It is, noted that the disclosed principles, tools 100 and methods 200 may be implemented in current metrology platforms and/or in metrology platforms under development to improve the accuracy of the metrology measurements (e.g., overlay measurements) and to provide metrology measurements which are more relevant to real devices.

Disclosed embodiments overcome disadvantages of bright field imaging such as the possibility for each pair of orders to contribute a different error to the overlay, thereby making it difficult to control the total error. Disclosed order selection is advantageous in reducing the error, as illustrated in a non-limiting manner by Equation 1, including only the lowest three diffraction orders (0 and ±1), with P denoting the pitch of the periodic target, $a_n$ denoting the diffraction amplitude of the $n^{th}$ order, $\Psi$ denoting the average phase difference between the $0^{th}$ and the $\pm 1^{st}$ diffraction orders, and $\delta\phi$ and $\delta a_1$ denoting the phase and amplitude differences, respectively, between the $+1^{st}$ and $-1^{st}$ orders, BF denotes the applicability of Equation 1 to bright field imaging, with the term (a tan($\delta a_1$ tan $\Psi$)) denoting the amplification of the target asymmetry error in bright field imaging. $X_0$ denotes the position of target center of symmetry.

$$I_{BF}(x) = $$

$$|a_0|^2 + |a_1|^2 + |a_{-1}|^2 + 4a_0\overline{a_1}\cos[\Psi]\cos\left[\frac{2\pi(x-x_0)}{P} + \delta\phi + \mathrm{atan}(\delta a_1 \tan\Psi)\right] + $$

$$a_1 a_{-1}\cos\left[\frac{4\pi(x-x_0)}{P} + 2\delta\phi\right]$$

The inventors note that while $\delta\phi$ causes an overlay error that may be assigned to the geometrical ambiguity due to target asymmetry, the second phase term in the first harmonic (a tan($\delta a_1$ tan $\Psi$)) may acquire any value in the range $$\left[-\frac{\pi}{2}, +\frac{\pi}{2}\right]$$

for arbitrary values of $\Psi$, and therefore overlay errors could be on the order of $$\frac{P}{4}.$$

For obvious reasons, tan $\Psi$ is often coined the inaccuracy magnification.

Figure 1:
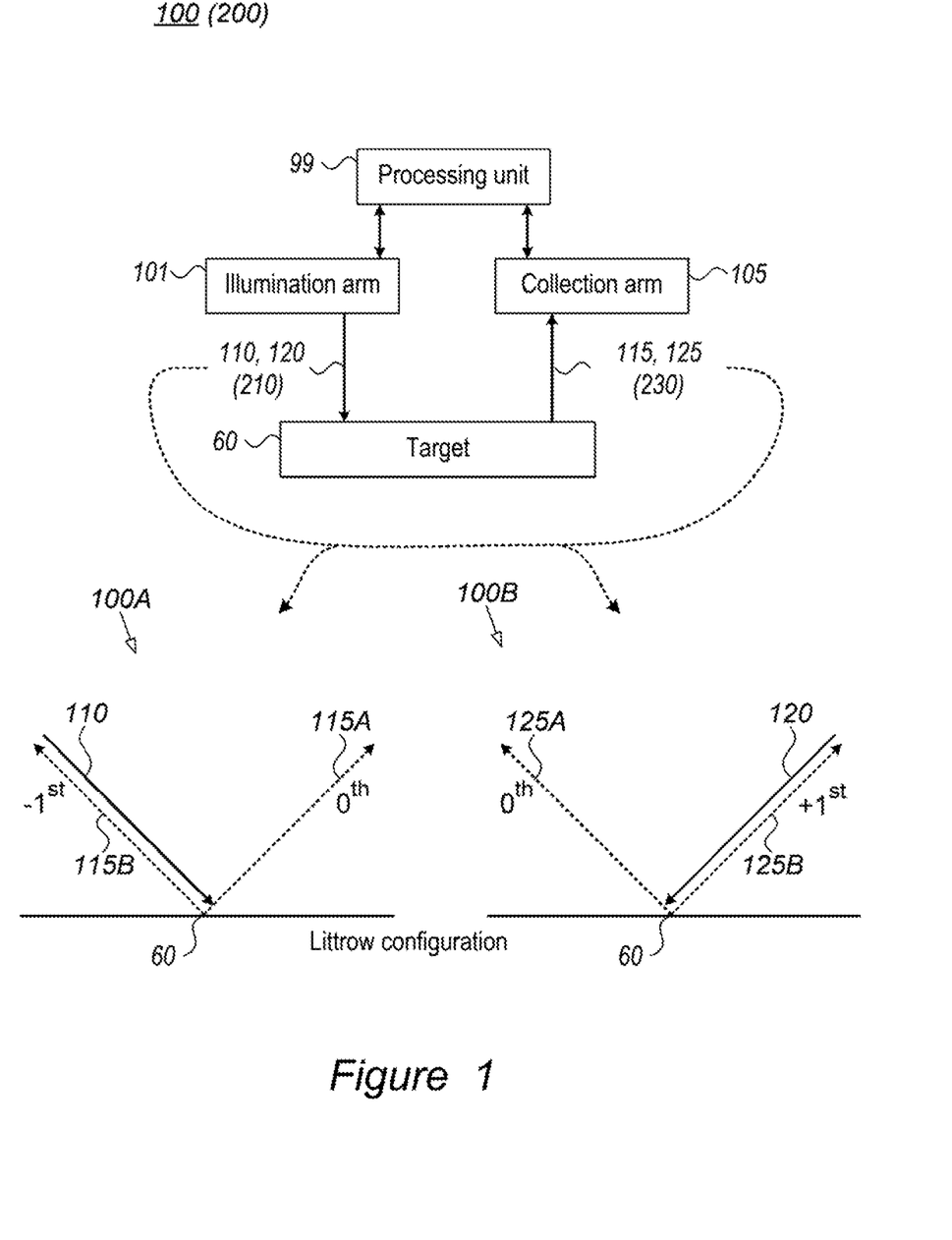
FIG. 1 is a high-level schematic block diagram illustrating metrology tools and target measurement methods, according to some embodiments of the invention.

FIG. 1 is a high-level schematic block diagram illustrating a metrology tool 100 and a target measurement method 200 (see also FIG. 5), according to some embodiments of the invention. Metrology tool 100 has an illumination arm 101 and a collection arm 105 associated with at least one processing unit 99 (e.g., in a metrology module), which are configured to perform metrology measurements of a metrology target 60 on the wafer, e.g., according to method 200.

Metrology tool 100 is configured to illuminate (stage 210, see FIG. 5) metrology target 60, by illumination arm 101, in a Littrow configuration, to yield, from a first incident illumination 110, a first measurement signal (see 100A) comprising a $-1^{st}$ diffraction order 115B and $0^{th}$ diffraction order 115A and, from a second incident illumination 120, a second measurement signal (see 100B) comprising a $+1^{st}$ diffraction order 125B and a $0^{th}$ diffraction order 125A, with $-1^{st}$ diffraction order 115B of the first measurement signal and $+1^{st}$ diffraction order 125B of the second measurement signal are diffracted at 180° to a direction of incident illumination 110 and 120, respectively.

Figure 5:
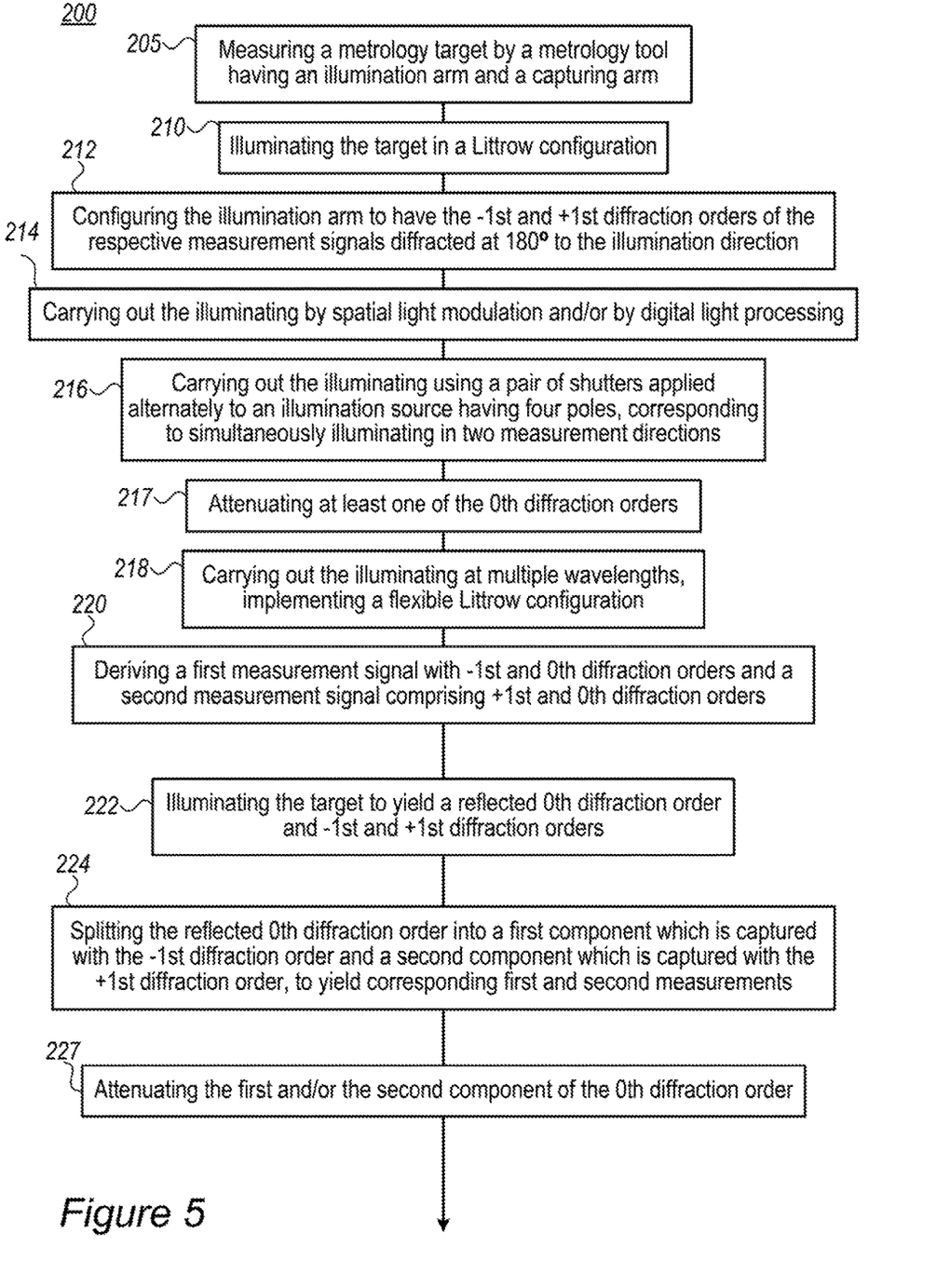
FIG. 5 is a high-level flowchart illustrating a method, according to some embodiments of the invention.

Metrology tool 100 is further configured to perform (stage 238), by collection arm 105, a first measurement of the first measurement signal (which includes $-1^{st}$ diffraction order 115B and $0^{th}$ diffraction order 115A) and a second measurement of the second measurement signal (which includes $+1^{st}$ diffraction order 125B and $0^{th}$ diffraction order 125A), e.g., using one or more camera(s) and/or sensor(s) and from the first and second measurements, to derive at least one metrology metric (stage 240, see further method stages in FIG. 5).

Certain embodiments comprise measuring the overlay in two different illumination conditions 100A, 100B, wherein in each illumination condition, the image (the first and the second measurement signals, respectively) is composed of only two orders: 0, +1 and 0, −1. The illumination angle may be set to satisfy $$\sin \theta_i = \pm \frac{\lambda}{2P}$$

(Littrow configuration) and therefore, according to the standard grating equation, the angle of the $n^{th}$ diffracted order satisfies $$\sin \theta_n = -\sin \theta_i + \frac{n\lambda}{P} = \frac{\lambda}{P}\left(\mp \frac{1}{2} + n\right).$$

In non-limiting embodiments, assuming $\lambda \approx P$ provides that only two orders fit within the numerical aperture, namely: for a negative angle illumination, the angles of the diffracted orders satisfy $$\sin \theta_{-1} = -\frac{\lambda}{2P}, \sin \theta_0 = +\frac{\lambda}{2P}$$

(illumination and measurement condition 100A), and for a positive angle illumination, they satisfy $$\sin \theta_1 = \frac{\lambda}{2P}, \sin \theta_0 = -\frac{\lambda}{2P}$$

(illumination and measurement condition 100B). It is noted that while FIG. 1 illustrates a one-dimensional setting, the same principles are applicable to two-dimensional settings (see e.g., FIGS. 2-4).

Equations 2 express the signal intensities $I_+(x)$ and $I_-(x)$ for conditions 100A, 100B, respectively.

$$I_+(x) = a_0^2 + a_1^2 + 2a_0 a_1 \cos\left(\frac{2\pi(x-x_0)}{P} + \Psi + \delta\phi\right)$$

$$I_-(x) = a_0^2 + a_{-1}^2 + 2a_0 a_{-1} \cos\left(-\frac{2\pi(x-x_0)}{P} + \Psi - \delta\phi\right)$$

Equation 2

Equation 3 expresses the overlay as a non-limiting example for the metrology metric that can be derived from the signals expressed by Equations 2, obtained from the phase difference $(\phi_+ - \phi_-)$ between the signals, which corresponds to $\delta\phi$ that can be derived from the signal measurements using Equations 2.

$$OVL = \frac{P}{4\pi}(\phi_+ - \phi_-) = x_0 + \frac{P}{2\pi}\delta\phi$$

Equation 3

Advantageously, disclosed metrology tools 100 and methods 200 exhibit the following beneficial characteristics (none of which limiting the invention): (i) The amplitude asymmetry has no effect on the inaccuracy; (ii) The average topographic phase cancels out and therefore there is no additional source of inaccuracy beyond the geometrical $$\text{ambiguity} - \frac{P}{2\pi}\delta\phi;$$

(iii) Symmetric aberrations are cancelled out since both orders go through the same optical path. As a result, the depth of focus depends on the illumination numerical aperture, rather than on the collection aperture; (iv) There is only a negligible contamination from higher diffraction orders at the pupil plane since the orders are at least twice more distant than they are in normal illumination conditions; and (v) No blocking element is required in the collection pupil for accuracy purposes. Certain embodiments may lack one or more of the characteristics listed herein, possibly due to specific configuration and practical tradeoff issues.

Figure 2:
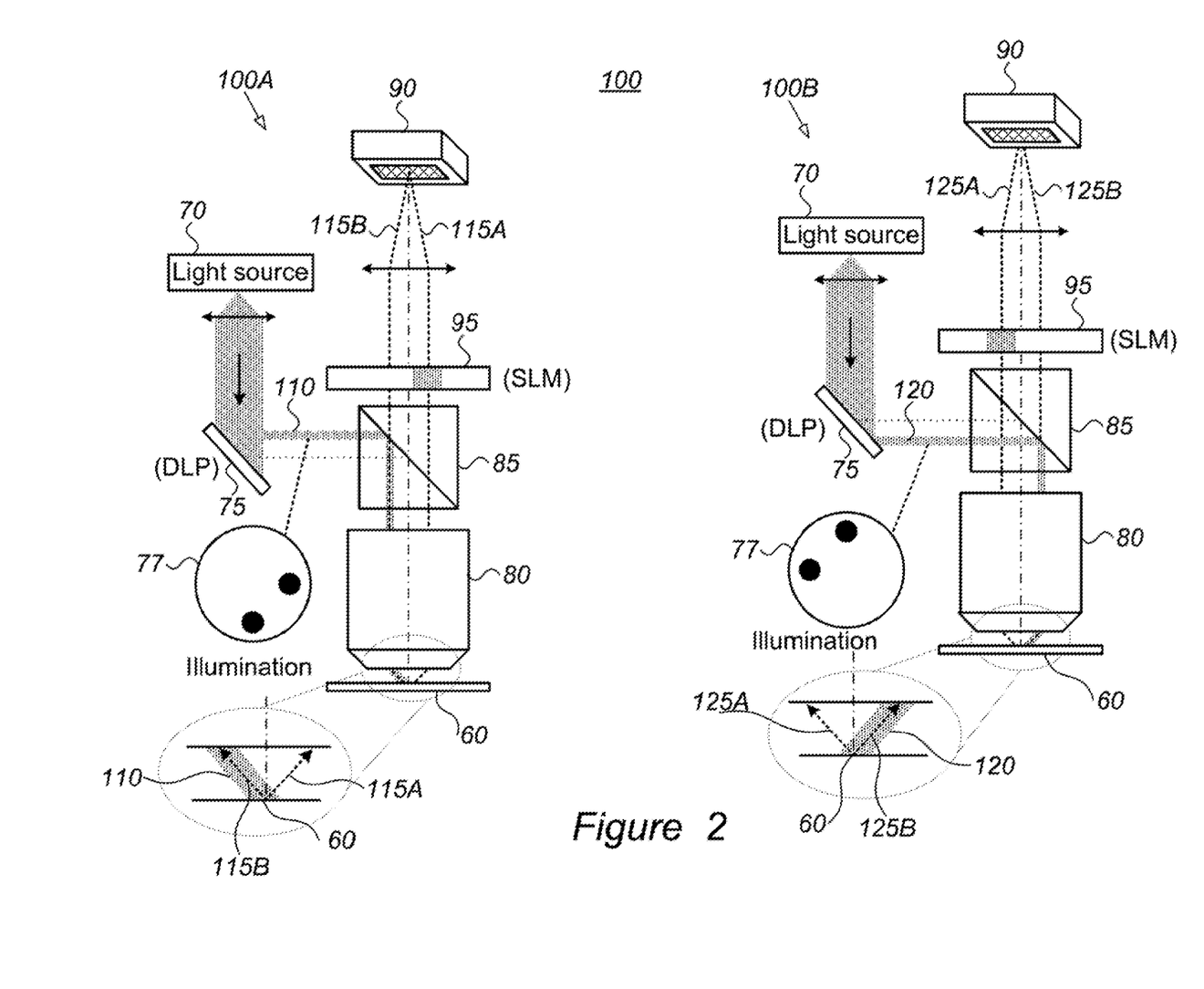
FIG. 2 is a high-level schematic illustration of metrology tools and measurements, implemented using variable illumination, according to some embodiments of the invention.

In any of the disclosed embodiments, a single grab option with corresponding illumination conditions (e.g., only one of left/upper or right\bottom illumination poles when referring e.g., to FIG. 2) may replace two different illumination conditions 100A, 100B, and two measurements may be carried at 0° and 180° degrees of wafer orientation. For example, all cells may be measured under a single illumination condition at both 0° and 180° degrees of wafer orientation trading off illumination condition modification for wafer movements. Advantageously, certain embodiments do not require carrying out thorough calibrations between positions/sizes of left and right poles in different illumination conditions 100A, 100B, while providing zero TIS (tool induced shift) measurements up to focus repeatability which is not significant due to large DOF (depth of field), compensating for the additional required MAM (move-acquire-measure) time.

Certain embodiments further comprise reducing target size (with the same target design), e.g., by a factor of two, reducing the pitch of the periodic structure by half, with respect to a given metrology target design, which is also made possibly using disclosed metrology tools 100 and methods 200 because they exhibit a reduced risk of sidelobes clipping by apertures in the pupil. In certain embodiments, target pitch may be reduced by a factor of two at the same wavelength, enhancing the compatibility of targets 60 with the devices.

In certain embodiments, metrology tools 100 and methods 200 may further comprise attenuating the zero order in the collection pupil to increase contrast with only a moderate or minor impact on the signal amplitude.

Advantageously, in comparison to prior art such as U.S. Pat. No. 7,528,953 which teaches simultaneous illumination of the target at opposite Littrow angles, and obtaining the overlay from a single image that is composed of the sum of the two interference terms: 0, +1 and 0, −1, and may therefore have an amplitude difference between the diffracted orders which is, coupled to the topographic phase, possibly leading to inaccuracy magnification. In contrast, certain embodiments of disclosed metrology tools 100 and methods 200 comprise using Consecutive illumination if the target, isolating and removing the amplitude difference as illustrated in Equations 2 and 3.

FIG. 2 is a high-level schematic illustration of metrology tool 100 and measurements 100A, 100B, implemented using variable illumination, according to some embodiments of the invention. FIG. 2 provides a non-limiting implementation example of a double-grab, Littrow illumination two-beam imaging measurement. In certain embodiments, illumination arm 101 may comprise a light source 70 and adaptive optics element(s) such as a digital light processor (DLP) 75, and collection arm 105 may comprise a sensing element such as camera(s) 90 and/or corresponding sensors and adaptive optics element(s) such as a spatial light modulator (SLM) 95—configured to implement flexible Littrow angle illumination and collection for varying wavelengths, e.g., to switch between the two Littrow configurations for the X and Y directions (see pupil plane illumination diagrams 77, with full black circles illustrating the illumination spots in the pupil plane). Illumination and collection arms 101, 105, respectively are associated by beam splitter 85 and directed through objective 80. Illumination 110, 120 in measurements 100A, 100B (also termed grabs), respectively, (each illustrated illumination beam 110, 120 comprises two beams, for corresponding directions X and Y) and diffraction orders −1 ($a_{-1}e^{i\varphi_{-1}}$) 115B, 0 ($Ta_0 e^{i\varphi_0}$) 115A and +1 ($a_1 e^{i\varphi_1}$) 125B, 0 ($Ta_0 e^{i\varphi_0}$) 125A, respectively, and in each of measurement directions X, Y, with T being an optional attenuation factor. It is noted that embodiments of adaptive optics element(s) such as DLP, SLM or other are interchangeable in various embodiments. Variable illumination and/or collection may be configured to achieve improved contrast. For low diffraction efficiency targets 60, the zero order may be attenuated (per illumination angle) with similar SLIM and/or DLP element(s), depending on whether measurement is carried out by transmission or reflection.

Figure 3:
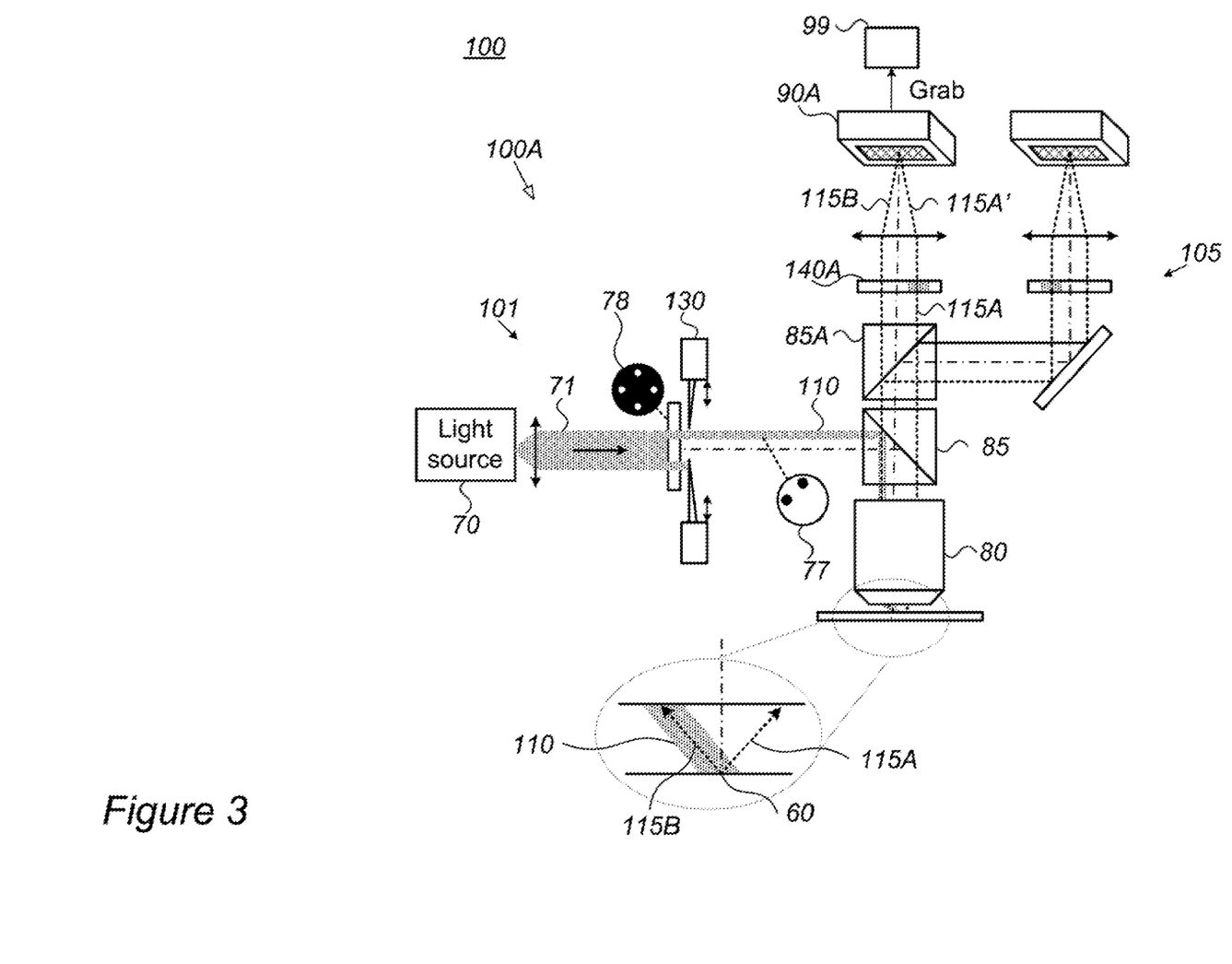
FIG. 3 is a high-level schematic illustration of metrology tools and measurements, implemented without using adaptive optics, according to some embodiments of the invention.

FIG. 3 is a high-level schematic illustration of metrology tool 100 and measurements 100A, 100B, implemented without using adaptive optics, according to some embodiments of the invention. Illumination arm 101 may provide illumination 71 and comprise a fixed mask 78 with, e.g., four poles (indicated schematically by the white circles) that illuminate simultaneously at opposite Littrow angles (e.g., for corresponding X and Y periodic structures of target 60). A shutter assembly 130, e.g., comprising a pair of knife-edge shutters mounted on fast motors, may be configured to block, alternately, the poles associated with the positive\negative illumination angles, as illustrated in measurement conditions 100A, 100B each illustrated illumination beam 110, 120 comprises two beams, for corresponding directions X and Y). Collection arm 105 may comprise corresponding collection elements, illustrated schematically, in a non-limiting manner, as two sub-arms each comprising camera 90A, 90B and a zeroth order attenuator 140A, 140B providing corresponding measurements 100A, 100B (also termed grabs) to processing unit 99. Zeroth order attenuation, using fixed elements, may be achieved by splitting the collected orders into two and placing two, semi-opaque masks 140A, 140B at the collection pupil, each attenuating a different pair of orders. In certain embodiments, variable optical elements such as DLP or SUM may be used for attenuating the zeroth order without splitting collection arm 105. An additional beam, splitter 85A may be used to split the collected radiation to the two sub-arms of collection arm 105. Certain embodiments may comprise optical manipulation in collection arm that enables using a single camera 90 and/or a single zeroth order attenuator 140 (not illustrated).

Figure 4:
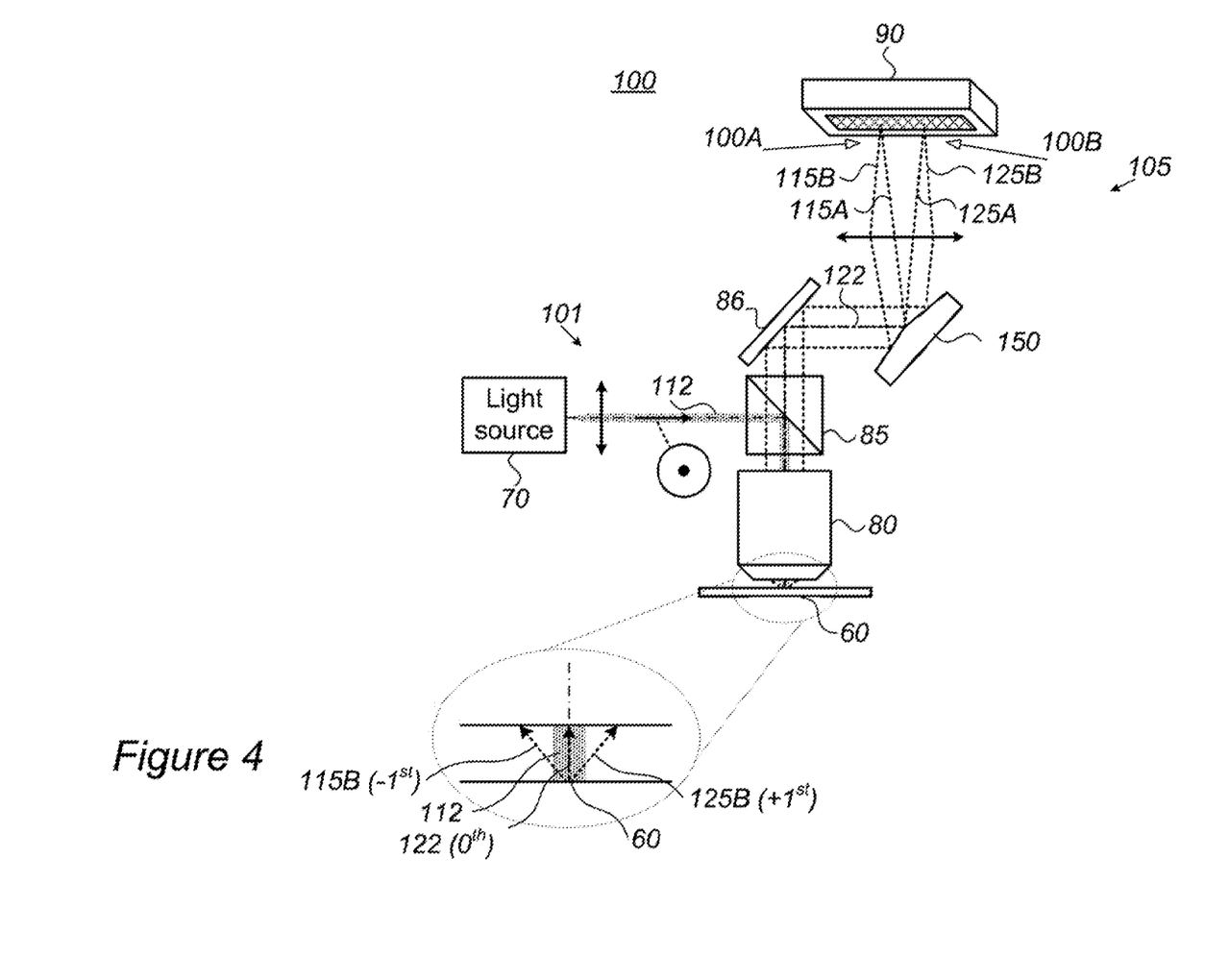
FIG. 4 is a high-level schematic illustration of metrology tools and measurements, implemented in a split image configuration, according to some embodiments of the invention.

FIG. 4 is a high-level schematic illustration of metrology tool 100 and measurements 100A, 100B, implemented in a split image configuration, according to some embodiments of the invention. Certain embodiments comprise metrology tools 100 comprising illumination arm 101 configured to illuminating target 60 by illumination 122 (equivalent to illumination 110 plus 120) to yield a reflected $0^{th}$ diffraction order 112 (equivalent to diffracted e orders 115A plus 125A) and $-1^{st}$ and $+1^{st}$ diffraction orders 115B, 125B, respectively. Disclosed Metrology tools 100 further comprise a collection arm 105 comprising an image splitter 150 (e.g., a prism such as a prism mirror, possibly via optical element(s) 86 such as a mirror) configured to split reflected $0^{th}$ diffraction order 122 into first component 115A which is captured with $-1^{st}$ diffraction order 115B and second component 125A which is captured with $+1^{st}$ diffraction order 125B, to yield corresponding first and second measurements, 100A, 100B, respectively. Metrology tools 100 further comprise processing unit 99 (e.g., associated with a metrology module) configured to derive at least one metrology metric from first and second measurements 100A, 100B, respectively. In various embodiments, illumination arm 101 and collection arm 105 may be configured to carry out the illuminating and the performing of the measurements simultaneously in two measurement directions X and Y). In some embodiments, collection arm 105 may comprise at least one $0^{th}$ diffraction order attenuator (not shown, see attenuators 140A, 140B) configured to attenuate at least one of first and second components 115A, 125A of $0^{th}$ diffraction order 122.

Certain embodiments of metrology tools 100 eliminate the inaccuracy beyond the ambiguity while not deteriorating the signal level, by using split-image configuration as illustrated schematically in FIG. 4. In certain embodiments, the collection pupil may be split at the middle (or at a given proportion, possibly related to the illumination wavelength) into two halves (or four quadrants when measuring periodic structures in two measurement direction, such as X and Y), for example using prism mirror 150 or other embodiments disclosed in U.S. Pat. No. 8,456,641, incorporated herein by reference in its entirety. The $+1^{st}$ order (125B) may be made to interfere with the positive half (as first component 125A) of $0^{th}$ order 122 to build one image 100A, and the $-1^{st}$ order (115B) may be made to interfere with the negative part (as second component 115A) of CP order 122 to build second image 100B. In certain embodiments, the overlay difference between the two images (100A, 100B) does not depend on the average topographic phase $\Psi$ (see Equation 1) and the amplitude of the signal decays only linearly with the diffraction efficiency, similar to the Littrow method and Littrow configurations disclosed above.

Certain embodiments further comprise calibrating first and second measurements 100A, 100B, respectively (e.g., corresponding images) for layer-dependent telecentricity. Certain embodiments further comprise deriving focus information from telecentricity parameters of first and second measurements 100A, 100B (e.g., corresponding images), e.g., obtaining the focal position of each layer from one (or more) grab(s), e.g., 100A and/or 100B. Certain embodiments comprise Obtaining focus sensitivity without splitting the pupil at the collection path, by using a non-Littrow, off-axis illumination and measuring the focus from the shift in the grating and/or cell position on the expense of increased sensitivity to symmetric aberrations.

Certain embodiments further comprise increasing contrast of low diffraction efficiency targets, by attenuating one or more of the zero order components 115A, 125A. Alternatively or complementarily, contrast loss caused by splitting $0^{th}$ order 122 (to two portions for each measurement directions, e.g., into four portions when two measurement directions are used) may be compensated for by various approaches, e.g., for two measurement directions, by splitting original signal 122 into four identical copies and then from each copy obtain a different image (not illustrated), by order selection of each of the combinations $(0^{th},+1_X^{st})$, $(0^{th},-1_X^{st})$, $(0^{th},+1_Y^{st})$ and $(0^{th},-1_Y^{st})$. Advantageously, splitting the signal to use only part of the zero order to create the respective signals with the first order signals (or parts thereof), provide a smaller amplitude of the zeroth order signal while maintaining all illumination points to interfere with the first orders (e.g., as whole signals.

In any of the disclosed embodiments, the metrology metric(s) such as overlay may be derived separately from the phases of the signals obtained from interference between the respective $0^{th}$ and $\pm 1^{st}$ orders.

Advantageously, disclosed tools 100 and methods 200 may be configured to provide superior accuracy and precision in IBO at low diffraction efficiency conditions, without the need for phase control. For example, relating to phase and amplitude control approaches, as taught e.g., in U.S. Patent Application Publication No. 2017/0146915, disclosed embodiments may be simpler to implement, easier to practice and present simpler system requirements to fulfill. In another example, disclosed tools 100 and methods 200 may be configured to provide higher signal amplitudes than approaches seeking; to minimize or eliminate the first order term $a_0$ (see Equation 1), such as taught by WIPO Publication No. 2007143056 which leave the signal amplitude to be related to $a_1^2$. The higher signal amplitudes achieved by disclosed tools 100 and methods 200 also improves the achieved signal to noise ratio.

It is, noted that elements from FIGS. 1-4 may be combined in any operable combination, and the illustration of certain elements in certain figures and not in others merely serves an explanatory purpose and is non-limiting.

FIG. 5 is a high-level flowchart illustrating a method 200, according to some embodiments of the invention. The method stages may be carried out with respect to metrology tool 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 comprises measuring a metrology target by a metrology tool having an illumination arm and a capturing arm (stage 205), including illuminating the target in a Littrow configuration (stage 210), deriving a first measurement signal with $-1^{st}$ and $0^{th}$ diffraction orders and a second measurement signal comprising $+1^{st}$ and $0^{th}$ diffraction orders (stage 228) by performing first and second measurements of the first and second measurement signals (stage 230) and deriving metrology metric(s) such as overlay from the first and second measurements (stage 240). In any of the disclosed embodiments, the first and second measurements may be carried at 0° and 180° degrees of wafer orientation, under the same illumination conditions (stage 231), trading off the modification of the illumination conditions for MAM time.

Method 200 may further comprise configuring the illumination arm to have the $-1^{st}$ and $+1^{st}$ diffraction orders of the respective measurement signals diffracted at 180° to the illumination direction (stage 212). In certain embodiments, method 200 may comprise carrying out the illuminating by spatial light modulation and/or by digital light processing (stage 214) and/or carrying out the illuminating using a pair of shutters applied alternately to an illumination source having four poles, corresponding to simultaneously illuminating in two measurement directions (stage 216). Certain embodiments comprise attenuating at least one of the 0m diffraction orders (stage 217). Certain embodiments comprise carrying out the illuminating at multiple wavelengths, implementing a flexible Littrow configuration (stage 218).

In certain embodiments, performing of the measurements may be carried, out by spatial light modulation and/or by digital light processing (stage 232). Certain embodiments comprise carrying, out the illuminating and the performing of the measurements simultaneously in two measurement directions (stage 234).

In certain embodiments, method 200 may further comprise reducing target size, e.g., by half, by reducing the pitches of the periodic structures, e.g., by a factor of two (stage 250), utilizing the disclosed Littrow configuration. In certain embodiments, method 200 may comprise illuminating the target, by the illumination arm, to yield a reflected $0^{th}$ diffraction order and $-1^{st}$ and $+1^{st}$ diffraction orders (stage 222), splitting, in the collection arm, the reflected $0^{th}$ diffraction order into a first component which is captured with the $-1^{st}$ diffraction order and a second component which is captured with the $+1^{st}$ diffraction order, to yield corresponding first and second measurements (stage 224), and deriving at least one metrology metric from the first and second measurements (stage 240). In various embodiments, illuminating 222 and splitting 224 may be carried out simultaneously in two measurement directions for each of the first and second measurements. In certain embodiments, method 200 may further comprise attenuating at least one of first and second components of the $0^{th}$ diffraction order (stage 227). The metrology metric(s) may comprise an overlay of the target, calculated from Equation 3.

Certain embodiments further comprise calibrating the first and second measurements (e.g., corresponding images), the images for layer-dependent telecentricity (stage 242). Certain embodiments further comprise deriving focus information from telecentricity parameters of the first and second measurements (e.g., corresponding images), e.g., obtaining the focal position of each layer from one (or more) grab(s) (stage 244). Certain embodiments comprise obtaining focus sensitivity without splitting the pupil at the collection path (stage 247), by using a non-Littrow, off-axis illumination and measuring the focus from the shift in the grating and/or cell position on the expense of increased sensitivity to symmetric aberrations.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two ions shown in succession may, in fact, be executed substantially concurrently, or the portions times be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of measuring a metrology target by a metrology tool having an illumination arm and a collection arm, the method comprising:
    illuminating the metrology target, by the illumination arm, in a Littrow configuration to yield a first measurement signal comprising a $-1^{st}$ diffraction order and a first component of a $0^{th}$ diffraction order and a second measurement signal comprising a $+1^{st}$ diffraction order and second component of the $0^{th}$ diffraction order, wherein the $-1^{st}$ diffraction order of the first measurement signal and the $+1^{st}$ diffraction order of the second measurement signal are diffracted at 180° to a direction of the illumination,
    performing, by the collection arm, a first measurement of the first measurement signal and a second measurement of the second measurement signal,
    attenuating at least one of the first and second components of the $0^{th}$ diffraction orders, and
    deriving at least one metrology metric from the first and second measurements.

2. The method of claim 1, wherein illuminating the metrology target is carried out by spatial light modulation and/or by digital light processing.

3. The method of claim 1, wherein illuminating the metrology target is carried out at multiple wavelengths, implementing a flexible Littrow configuration.

4. The method of claim 1, wherein performing the first measurement and the second measurement is carried out by spatial light modulation and/or by digital light processing.

5. The method of claim 1, wherein illuminating the metrology target and performing the first measurement and the second measurement are carried out simultaneously in two measurement directions.

6. The method of claim 1, wherein illuminating the metrology target is carried out using a pair of shutters applied alternately to an illumination source having four poles, corresponding to simultaneously illuminating in two measurement directions.

7. The method of claim 1, wherein the at least one metrology metric comprises an overlay of the metrology target, calculated from an equation:

$$OVL = \frac{P}{4\pi}(\phi_+ - \phi_-) = x_0 + \frac{P}{2\pi}\delta\phi,$$

wherein OVL denotes the overlay of the metrology target, P denotes a pitch of the metrology target, $(\phi_+ - \phi_-)$ denotes a phase difference between the second measurement signal and the first measurement signal, $x_0$ denotes a position of a center of symmetry of the metrology target and $\delta_\phi$ denotes a difference between the $+1^{st}$ diffraction order and the $-1^{st}$ diffraction order.

8. The method of claim 1, further comprising reducing a size of the metrology target by half, by reducing a periodic structure pitch of the metrology target by a factor of two with respect to a given metrology target design.

9. The method of claim 1, wherein the first and second measurements are carried out at 0° and 180° degrees of wafer orientation.

10. The method of claim 1, wherein the deriving is carried out by at least one computer processor.

11. A computer program product comprising a non-transitory computer readable storage medium having a computer readable program embodied therewith and configured to carry out the method of claim 1.

12. A metrology module comprising the computer program product of claim 11.

13. A metrology tool comprising:
an illumination arm configured to illuminate a metrology target in a Littrow configuration to yield a first measurement signal comprising a $-1^{st}$ diffraction order and a first component of a $0^{th}$ diffraction order and a second measurement signal comprising a $+1^{st}$ diffraction order and a second component of the $0^{th}$ diffraction order, wherein the $-1^{st}$ diffraction order of the first measurement signal and the $+1^{st}$ diffraction order of the second measurement signal are diffracted at 180° to a direction of the illumination,
a collection arm configured to perform a first measurement of the first measurement signal and a second measurement of the second measurement signal, wherein the collection arm comprises at least one $0^{th}$ diffraction order attenuator, and
a processing unit configured to derive at least one metrology metric from the first and second measurements.

14. The metrology tool of claim 13, wherein at least one of the illumination arms and the collection arm comprises a spatial light modulator and/or a digital light processor configured to implement a flexible Littrow configuration corresponding to illumination by multiple wavelengths.

15. The metrology tool of claim 13, wherein the illumination arm and the collection arm are configured to illuminate the metrology target and perform the first and second measurements simultaneously in two measurement directions.

16. The metrology tool of claim 13, wherein the illumination arm comprises a pair of shutters applied alternately to an illumination source having four poles, corresponding to simultaneous illumination in two measurement directions.

17. The metrology tool of claim 13, wherein the first and second measurements are carried out at 0° and 180° degrees of wafer orientation.

18. A method of measuring a metrology target by a metrology tool having an illumination arm and a collection arm, the method comprising:
illuminating the metrology target, by the illumination arm, to yield a reflected $0^{th}$ diffraction order and $-1^{st}$ and $+1^{st}$ diffraction orders,
splitting, in the collection arm, the reflected $0^{th}$ diffraction order into a first component which is captured with the $-1^{st}$ diffraction order to yield a first measurement and a second component which is captured with the $+1^{st}$ diffraction order to yield a second measurement,
attenuating at least one of first and second components of the $0^{th}$ diffraction order, and
deriving at least one metrology metric from the first and second measurements.

19. The method of claim 18, wherein illuminating the metrology target and the splitting the reflected $0^{th}$ diffraction order are carried out simultaneously in two measurement directions for each of the first and second measurements.

20. The method of claim 18, wherein the at least one metrology metric comprises an overlay of the metrology target, calculated from an equation:

$$OVL = \frac{P}{4\pi}(\phi_+ - \phi_-) = x_0 + \frac{P}{2\pi}\delta\phi,$$

wherein OVL denotes the overlay of the metrology target, P denotes a pitch of the metrology target, $(\phi_+-\phi_-)$ denotes a phase difference between the second measurement signal and the first measurement signal, $x_0$ denotes a position of a center of symmetry of the metrology target and $\delta_\phi$ denotes a difference between the $+1^{st}$ diffraction order and the $-1^{st}$ diffraction order.

21. The method of claim 18, further comprising calibrating the first and second measurements for layer-dependent telecentricity.

22. The method of claim 18, further comprising deriving focus information from telecentricity parameters of the first and second measurements.

23. The method of claim 18, further comprising obtaining focus sensitivity data using a non-Littrow, off-axis illumination and measuring the focus from a position shift in the metrology target.

24. The method of claim 18, wherein the deriving is carried out by at least one computer processor.

25. A computer program product comprising a non-transitory computer readable storage medium having a computer readable program embodied therewith and configured to carry out the method of claim 18.

26. A metrology module comprising the computer program product of claim 25.

27. A metrology tool comprising:
an illumination arm configured to illuminating a metrology target to yield a reflected $0^{th}$ diffraction order and $-1^{st}$ and $+1^{st}$ diffraction orders,
a collection arm comprising an image splitter configured to split the reflected $0^{th}$ diffraction order into a first component which is captured with the $-1^{st}$ diffraction order to yield a first measurement and a second component which is captured with the $+1^{st}$ diffraction order to yield a second measurement, wherein the collection arm comprises at least one $0^{th}$ diffraction order attenuator configured to attenuate at least one of first and second components of the $0^{th}$ diffraction order, and
a processing unit configured to derive at least one metrology metric from the first and second measurements.

28. The metrology tool of claim 27, wherein the illumination arm and the collection arm are configured to illuminate the metrology target and perform the first and second measurements simultaneously in two measurement directions.

29. The metrology tool of claim 27, wherein the processing unit is further configured to carry out at least one of: calibrating the first and second measurements for layer-dependent telecentricity, deriving focus information from telecentricity parameters of the first and second measurements, and/or obtaining focus sensitivity data using a non-Littrow, off-axis illumination and measuring the focus from a position shift in the metrology target.

* * * * *